US009356187B2

(12) United States Patent  
Ryu et al.

(10) Patent No.: US 9,356,187 B2
(45) Date of Patent: May 31, 2016

(54) METHOD FOR SEPARATING SEMICONDUCTOR DEVICES USING NANOPOROUS STRUCTURE

(71) Applicants: Seoul Viosys Co., Ltd., Ansan-si (KR); University Industry Liaison Office of Chonnam National University, Gwangju (KR)

(72) Inventors: Sang Wan Ryu, Ansan-si (KR); Jin Ho Kang, Ansan-si (KR)

(73) Assignees: Seoul Viosys Co., Ltd., Ansan-si (KR); University Industry Liaison Office of Chonnam National University, Gwangju (KR)

( * ) Notice: Subject to any disclaimer, the term of this patent is extended or adjusted under 35 U.S.C. 154(b) by 115 days.

(21) Appl. No.: 14/377,101

(22) PCT Filed: Feb. 6, 2013

(86) PCT No.: PCT/KR2013/000934
§ 371 (c)(1),
(2) Date: Jan. 5, 2015

(87) PCT Pub. No.: WO2013/119029
PCT Pub. Date: Aug. 15, 2013

(65) Prior Publication Data
US 2015/0125981 A1 May 7, 2015

(30) Foreign Application Priority Data
Feb. 6, 2012 (KR) .................. 10-2012-0011655

(51) Int. Cl.
*H01L 33/00* (2010.01)
*H01L 21/762* (2006.01)
*H01L 33/32* (2010.01)

(52) U.S. Cl.
CPC ...... *H01L 33/0079* (2013.01); *H01L 21/76259* (2013.01); *H01L 33/0075* (2013.01); *H01L 33/32* (2013.01)

(58) Field of Classification Search
None
See application file for complete search history.

(56) References Cited

U.S. PATENT DOCUMENTS

2012/0241764 A1* 9/2012 Ogihara .............. H01L 21/0237
257/77
2013/0228807 A1* 9/2013 Peng .................. H01L 33/0079
257/95

FOREIGN PATENT DOCUMENTS

| JP | 2001-223165 | 8/2001 |
| KR | 10-2007-0005984 | 1/2007 |
| KR | 10-1001773 | 12/2010 |
| KR | 10-1001782 | 12/2010 |

OTHER PUBLICATIONS

International Search Report issued on Jun. 7, 2013 in International Application No. PCT/KR2013/000934.

(Continued)

*Primary Examiner* — Khaja Ahmad
(74) *Attorney, Agent, or Firm* — H.C. Park & Associates, PLC

(57) ABSTRACT

The present invention relates to a method for separating semiconductor devices from a substrate using a nanoporous structure, wherein electrochemical etching is carried out in the absence of a surface metal layer, then the surface metal layer is deposited, and then a GaN thin film is transferred onto a metal wafer by means of wafer bonding and lift-off. The method for separating the semiconductor devices using a nanoporous structure includes the steps of: growing a first n-type nitride layer on the substrate; growing a dielectric layer on the first n-type nitride layer; forming a nanoporous structure in the first n-type nitride layer by means of electrochemical etching; re-growing a second n-type nitride layer on the first n-type nitride layer so as to form a second n-type nitride layer containing the dielectric layer; growing a multi-quantum well structure and a p-type nitride layer on the second n-type nitride layer for bonding with a conductive substrate; and separating the semiconductor devices from the substrate through selective HF etching of the dielectric layer.

9 Claims, 5 Drawing Sheets

(56) References Cited

OTHER PUBLICATIONS

Written Opinion issued on Jun. 7, 2013 in International Application No. PCT/KR2013/000934.

Zhang, et al., "A Conductivity-based Selective Etching for Next Generation GaN Devices," Phys. Status Solidi B 247, p. 1713-1716 (2010).

Park, et al., Doping Selective Lateral Electrochemical Etching of GaN for Chemical Lift-Off Applied Physics Letters 94, Jun. 5, 2009, pp. 1-3, 221907.

Park, et al., "Fabrication of a High Density Nano-Pattern by Using Anodized Aluminum Oxide," New Physics, 56, p. 469-474 (2008).

Cheung, et al., "Fabrication of Nanopillars by Nanosphere Lithography," Nanotechnology 17, p. 1339-1343 (2006).

Campbell, et al., "Fabrication of Photonic Crystals for the Visible Spectrum by Holographic Lithography," Nature 404, p. 53-56 (2000).

* cited by examiner

Sectional view

Plan view (4a)

Sectional view

Plan view (4b)

METHOD FOR SEPARATING SEMICONDUCTOR DEVICES USING NANOPOROUS STRUCTURE

CROSS-REFERENCE TO RELATED APPLICATIONS

This application is the National Stage of International Application PCT/KR2013/000934, filed on Feb. 6, 2013, and claims priority from and the benefit of Korean Patent Application No. 10-2012-0011655, filed on Feb. 6, 2012, which are incorporated by reference for all purposes as if fully set forth herein.

BACKGROUND

1. Field

The present invention relates to a method for separating semiconductor devices from a substrate using a nanoporous structure, and more particularly, to a method for separating semiconductor devices from a substrate using a nanoporous structure, wherein a surface metal layer is deposited after electrolytic etching in the absence of the surface metal layer and then a GaN thin film is transferred to a metal wafer by wafer bonding and lift-off processes.

2. Discussion of the Background

Currently, gallium nitride (GaN; Gallium Nitride) is typically used in fabrication of light emitting diodes (LED; Light-Emitting diodes). GaN is generally formed on a sapphire substrate, which is an electrically non-conductive material. In this case, however, there are problems such as increase in resistance due to horizontal transfer of current, increase in operating temperature of devices due to low thermal conductivity of the sapphire substrate, and the like. To resolve such problems, it has been studied to separate LED structures from a substrate and to transfer the LED structures to a conductive substrate having high thermal and electrical conductivity.

Particularly, a lift-off process for separating a thin GaN layer from a sapphire substrate plays a very important role in fabrication of a vertical type LED. Currently, although a laser lift-off (LLO) process is generally used in the art, this process has various problems such as high fabrication cost and low yield due to long process time and thermal damage during processing. Thus, various studies have been made to develop a chemical lift-off (CLO) process based on chemical etching in order to resolve such problems.

Chemical lift-off (CLO) can be realized in various ways. Particularly, Korean Patent Registration No. 10-1001782 (Title of the Invention: Method for separating semiconductor device from substrate) and Korean Patent Registration No. 10-1001773 (Title of the Invention: Method for selective etching of semiconductor region) also disclose techniques relating to chemical lift-off. However, in these techniques, when metal for wafer bonding is deposited onto a wafer, electrochemical reaction intensively occurs on the metal surface in the course of electrolytic etching, thereby causing significant deterioration in electrochemical etching properties on the surface of GaN.

SUMMARY

The present invention has been conceived to solve such problems in the art and is aimed at providing a method for separating semiconductor devices from a substrate using a nanoporous structure, in which a surface metal layer is deposited after electrochemical etching in the absence of the surface metal layer, thereby allowing semiconductor devices to be easily transferred onto a metal wafer through wafer bonding and lift-off.

In addition, the present invention is aimed at providing a method for separating semiconductor devices from a substrate using a nanoporous structure, which can provide sufficient mechanical strength to a device structure before wafer bonding, and allows the device structure to be easily separated from the substrate after wafer bonding, in a lift-off process of the semiconductor devices.

In accordance with one aspect of the present invention, a method for separating semiconductor devices from a substrate using a nanoporous structure comprises: growing a first n-type nitride layer on a substrate; growing a dielectric layer on the first n-type nitride layer; forming a nanoporous structure within the first n-type nitride layer through electrolytic etching; re-growing a second n-type nitride layer on the first n-type nitride layer to form a second n-type nitride layer comprising the dielectric layer; forming a multi-quantum well structure and a p-type nitride layer on the second n-type nitride layer, and bonding the multi-quantum well structure and the p-type nitride layer to a conductive substrate; and separating semiconductor devices from the substrate through selective HF etching of the dielectric layer.

In accordance with another aspect of the present invention, a method for separating semiconductor devices from a substrate using a nanoporous structure comprises: forming a first n-type nitride layer on a substrate; forming a dielectric layer on the first n-type nitride layer such that a pattern pitch of the dielectric layer corresponds to a semiconductor chip size; forming a nanoporous structure within the first n-type nitride layer through electrolytic etching; re-growing a second n-type nitride layer on the first n-type nitride layer; growing a multi-quantum well structure and a p-type nitride layer on the second n-type nitride layer, followed by bonding the multi-quantum well structure and the p-type nitride layer to a conductive substrate; and separating semiconductor devices from the substrate through selective HF etching of the dielectric layer.

According to the present invention described above, since the method employs a chemical lift-off process, which is more effective in fabrication of vertical type LEDs than other types of lift-off processes, it is possible to replace an existing laser lift-off process and to perform a wafer processing without expensive equipment.

Further, the method can form a structure which can provide sufficient mechanical strength to device structures before wafer bonding, while allowing the device structures to be easily separated from the substrate after wafer bonding, in a lift-off process of semiconductor devices.

Furthermore, when a dielectric layer is formed in a lattice pattern such that a pattern pitch of the dielectric layer corresponds to a semiconductor chip size, semiconductor chips can be directly used without a separate process, after the lift-off process.

DETAILED DESCRIPTION OF THE ILLUSTRATED EMBODIMENTS

Features and advantages of the present invention will be more clearly understood from the following detailed description taken in conjunction with the accompanying drawings. In the following description, it should be noted that detailed descriptions of features and functions apparent to those skilled in the art are omitted for clarity.

Hereinafter, exemplary embodiments of the present disclosure will be described in detail with reference to the accompanying drawings.

The present invention relates to a method for separating semiconductor devices using a nanoporous structure, and will be described with reference to FIG. 1 to FIG. 5.

Figure 1:
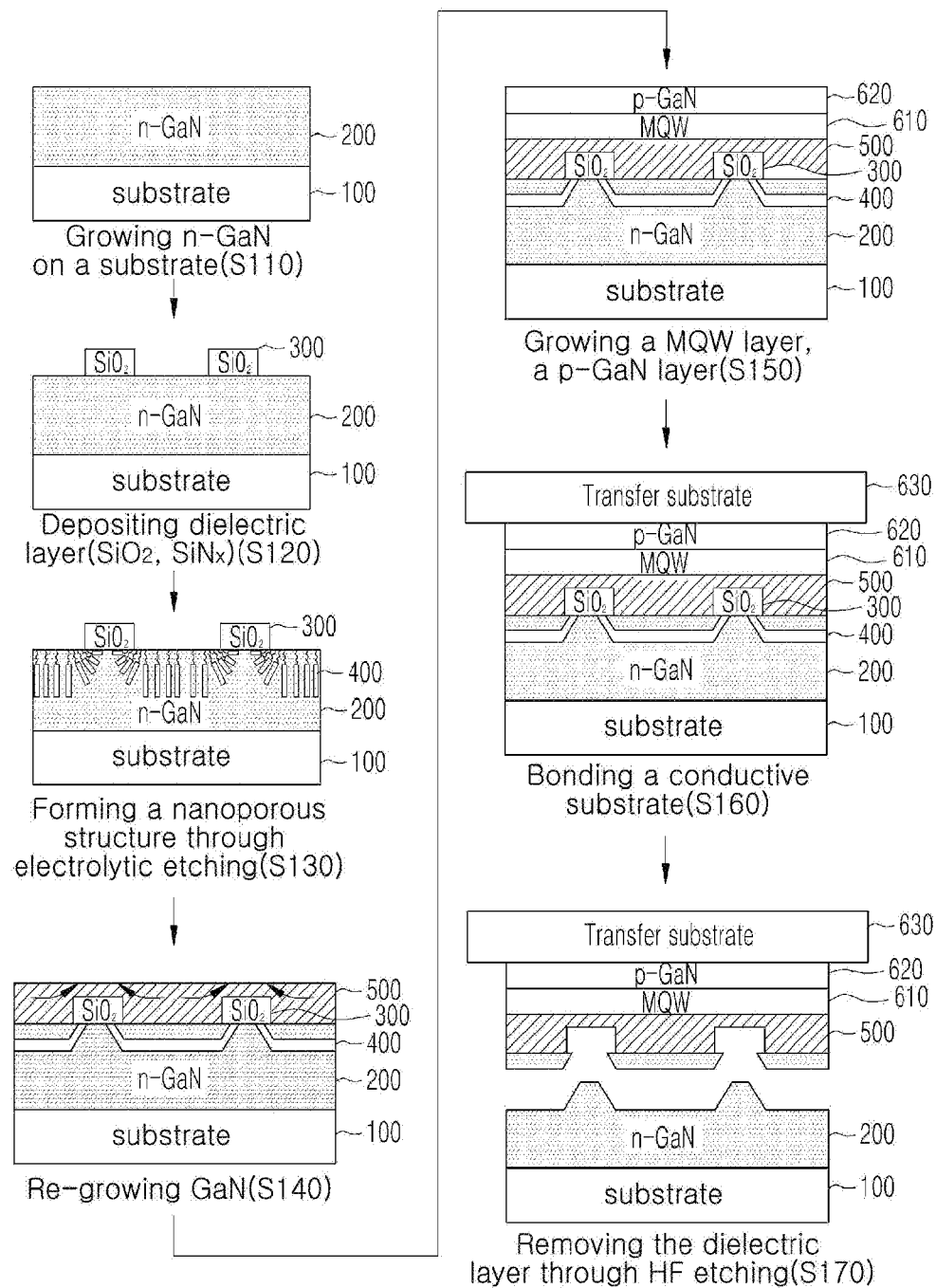
FIG. 1 is a flow diagram of a method for separating semiconductor devices from a substrate using a nanoporous structure in accordance with one exemplary embodiment of the present invention.

FIG. 1 is a flow diagram of a method for separating semiconductor devices from a substrate using a nanoporous structure in accordance with one exemplary embodiment of the present invention.

First, a first n-type nitride layer 200 is grown on a substrate 100 (S110). Although the first n-type nitride layer can be grown by various methods, typical metal organic chemical vapor deposition (MOCVD) will be described herein.

The substrate 100 may be a gallium nitride substrate, a SiC substrate, a GaAs substrate, a Si substrate, a ZnO substrate, or the like. Generally, a sapphire substrate is used. This is because gallium nitride layers grown on the sapphire substrate have good crystallinity and secure economic feasibility.

Herein, the first n-type nitride layer 200 refers to a compound semiconductor doped with n-type impurities and composed of nitrogen and Group III elements. Examples of the Group III elements comprise aluminum (Al), gallium (Ga), indium (In), and the like. These elements may be used alone or in combination thereof. Thus, it can be understood that the first n-type nitride layer may comprise GaN, AlN, InN, AlGaN, AlInN, GaInN, AlInGaN, and the like.

When generalized, the Group III nitride can be represented by Formula of, for example, $Al_xIn_yGa_{1-x-y}N$ ($0 \leq x \leq 1$, $0 \leq y \leq 1$, and $0 \leq x+y \leq 1$). In one embodiment, the first n-type nitride layer may comprise GaN as the Group III nitride, but the present invention is not limited thereto.

After operation S110, a dielectric layer 300 is grown on the first n-type nitride layer 200 (S120). The dielectric layer 300 acts as a sacrificial layer upon etching and can be formed of any material so long as the selected material allows selective etching. Preferably, the dielectric layer is formed of $SiO_2$ or $SiN_x$.

Figure 4A:
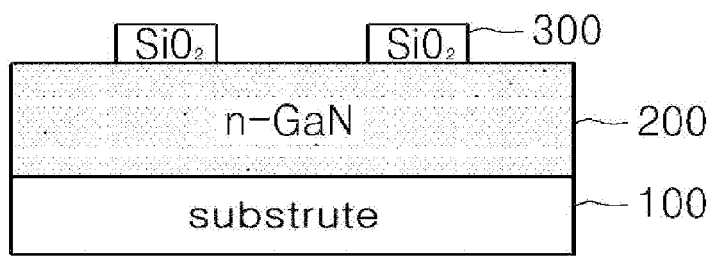
FIG. 4a is views illustrating formation of a dielectric layer in a stripe pattern in accordance with one exemplary embodiment of the present invention.
Figure 4A:
Figure 4B:
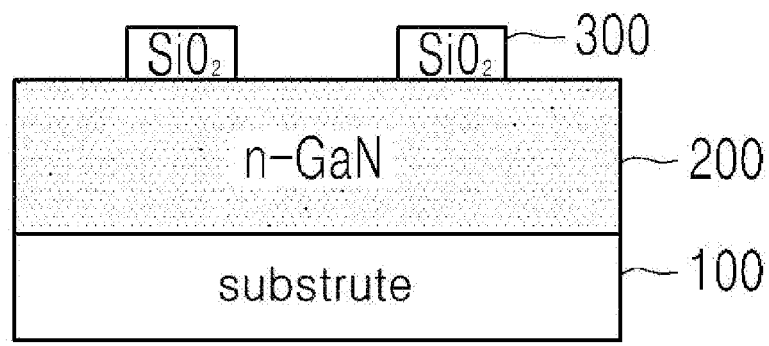
FIG. 4b is views illustrating formation of a dielectric layer in a lattice pattern in accordance with one exemplary embodiment of the present invention.
Figure 4B:
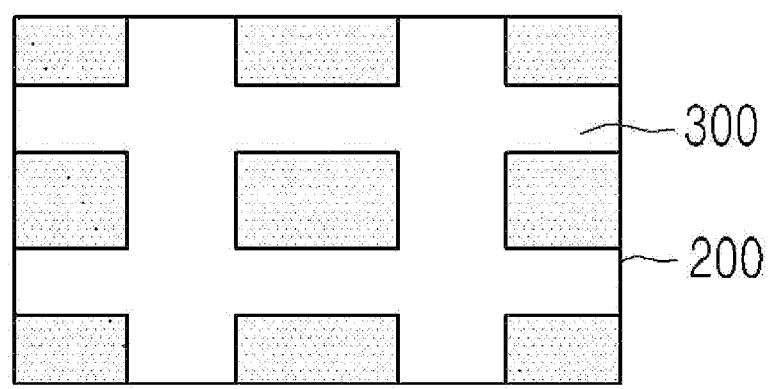

In S120, the dielectric layer is grown in a stripe pattern or in a lattice pattern. FIG. 4a is views illustrating formation of a dielectric layer in a stripe pattern in accordance with one exemplary embodiment of the present invention, and FIG. 4b is views illustrating formation of a dielectric layer in a lattice pattern in accordance with one exemplary embodiment of the present invention.

The pattern of the dielectric layer 300 may be realized by photolithography or nano-patterning. Photolithography is a representative semiconductor patterning method and can be carried out at a wafer level at low cost. The stripe pattern or lattice pattern having a width and a pith of 1 micrometer or more can be realized through photolithography. A lower pattern pitch provides higher mechanical strength to a thin GaN layer, and a pattern pitch of 1 micrometer or less requires a nano-patterning process. Nano-patterning at the wafer level can be realized by aluminum anodizing, laser holography patterning, nanoparticle coating, and the like. Since these methods are based on spontaneous formation of a pattern, the methods provide low uniformity to the pattern and form the pattern of inherent shapes depending thereon.

Aluminum anodizing, laser holography patterning, and nanoparticle coating can be easily performed by those skilled in the art, and thus detailed descriptions thereof are omitted herein. See reference documents as follows.

Aluminum anodizing is disclosed in "Fabrication of a High Density Nano-pattern by Using Anodized Aluminum Oxide", Park Jun-mo, Song Gwang-min, Ryu Sang-wan, New Physics, 56, p. 469-474 (2008); laser holography patterning is disclosed in "Fabrication of photonic crystals for the visible spectrum by holographic lithography", M. Campbell, D. N. Sharp, M. T. Harrison, R. G. Denning & A. J. Turberfield, Nature 404, p. 53-56 (2000); and nanoparticle coating is disclosed in "Fabrication of nanopillars by nanosphere lithography", C. L. Cheung, R. J. Nikolic, C. E. Reinhardt, and T. F. Wang, Nanotechnology 17, p. 1339-1343 (2006).

Consequently, the width, pitch and shape of the pattern vary depending upon a pattern formation method, and a suitable pattern formation method can be selected according to embodiments in practice. Here, it should be understood that the aforementioned method relates to one example of a method for forming the pattern of the dielectric layer 300, and the present invention is not limited thereto.

On the other hand, since the dielectric layer 300 is removed from a side of a second n-type nitride layer 500 described below through selective etching using an etchant such as HF after re-growth of the second n-type nitride layer 500, all of the patterns of the dielectric layer are connected to each other in a net shape or a stripe shape. If there is an independent pattern not connected to the dielectric layer 300 at one side of the second n-type nitride layer, the independent pattern does not allow etching and thus makes it difficult to achieve suitable separation from the substrate.

After operation S120, a nanoporous structure 400 is formed within the first n-type nitride layer 200 through electrolytic etching (S130). Since the nanoporous structure can be obtained through regulation of doping concentration of an n-type nitride and etching voltage as in a typical method of forming the nanoporous structure, a detailed description thereof will be omitted herein.

In one embodiment, the nanoporous structure may be formed by a process as disclosed in "Doping selective lateral eletrochemical etching of GaN for chemical lift-off" (by, Joonmo park, Kwang Min Seong, Seong-Ran Jeon, Jong Hyeob Baek, and Sang-Wan Ryu, Appl. Phys. Lett. 95, p. 221907 (2009), or "A conductivity-based selective etching for next generation GaN device" (by, Yu Zhang, Sang-Wan Ryu, Chris Yerino, Benjamin Leung, Qian Sun, Qinghai Song, Hui Cao and Jung Han, Phys. Status Solidi B 247, p. 1713-1716 (2010).

Figure 2A:
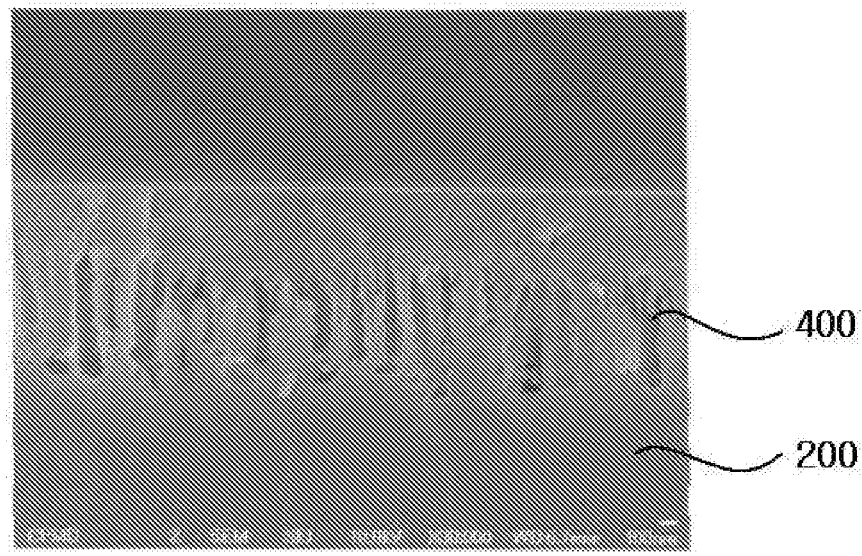
FIG. 2a is an electron micrograph of a nanoporous structure that does not comprise dielectrics in accordance with one exemplary embodiment of the present invention.
Figure 2B:
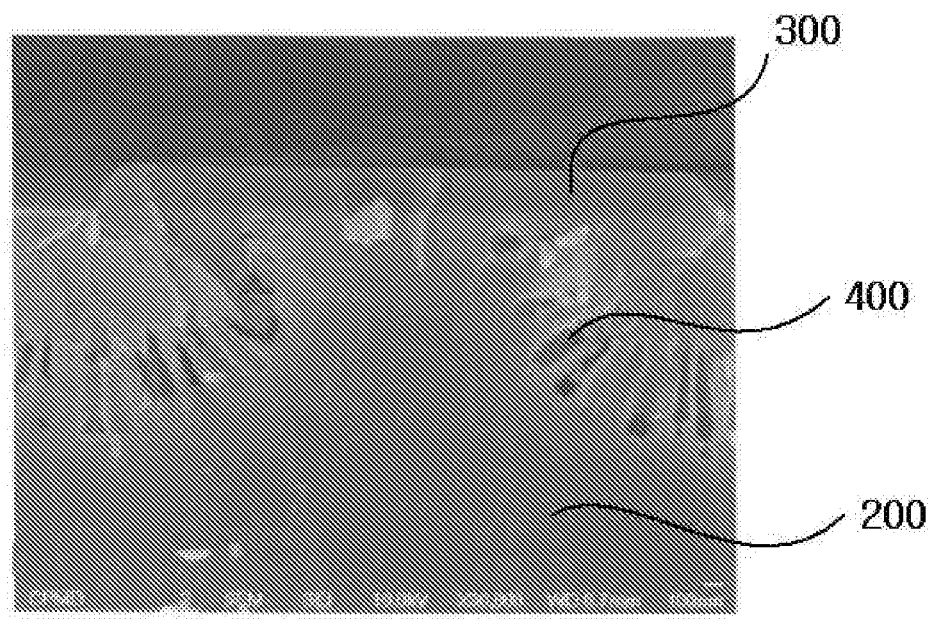
FIG. 2b is an electron micrograph of a nanoporous structure comprising a dielectric layer in accordance with one exemplary embodiment of the present invention.

The typical nanoporous structure 400 formed within the first n-type nitride layer has an elongated shape in a transverse direction, as shown in FIG. 2a. On the other hand, when the nanoporous structure 400 is formed after formation of the dielectric layer 300, the nanoporous structure 400 has a structure as shown in FIG. 2b. In this case, since the dielectric layer 300 on the first n-type nitride layer 200 obstructs formation of the nanoporous structure, it is possible to form a nanoporous structure 400 that has an elongated shape in the transverse direction while forming circles at both sides of the dielectric layer.

Particularly, in operation S130, the etching voltage is adjusted to have a low porosity at the upper portion of the nanoporous structure and a high porosity at a lower portion thereof in order to facilitate re-growth of the second n-type nitride layer 500 described below. That is, etching at a constant voltage can form a nanoporous structure having a constant porosity, and etching at various voltages can form a porous structure having various porosities.

At the same doping concentration, porosity increases with increasing voltage and decreases with decreasing voltage. Otherwise, at the same voltage, porosity increases with increasing doping concentration. The nanoporous structure of FIG. 2 was formed to have a low porosity at the upper portion thereof and a high porosity at the lower portion thereof by setting an initial voltage to a low value, followed by increasing the voltage after a predetermined period of time, at the same doping concentration.

After operation S130, a second n-type nitride layer 500 comprising the dielectric layer 300 is formed by re-growing the second n-type nitride layer 500 on the first n-type nitride layer 200 (S140). Growth of the second n-type nitride layer occurs on a surface of the first n-type nitride layer 200 and does not occur on the dielectric layer 300. When the height of the second n-type nitride layer 500 reaches an upper side of the dielectric layer 300, the second n-type nitride layer 500 grows laterally while growing upwards, and finally provides a flat surface by completely covering the dielectric layer 300.

In operation S140, high temperature is maintained, thereby causing deformation of the nanoporous structure 400. High thermal energy causes movement of atoms on surfaces of nano-pores, so that adjacent nano-pores having an elongated cylinder shape combine with each other, thereby forming a spherical cavity.

Figure 3:
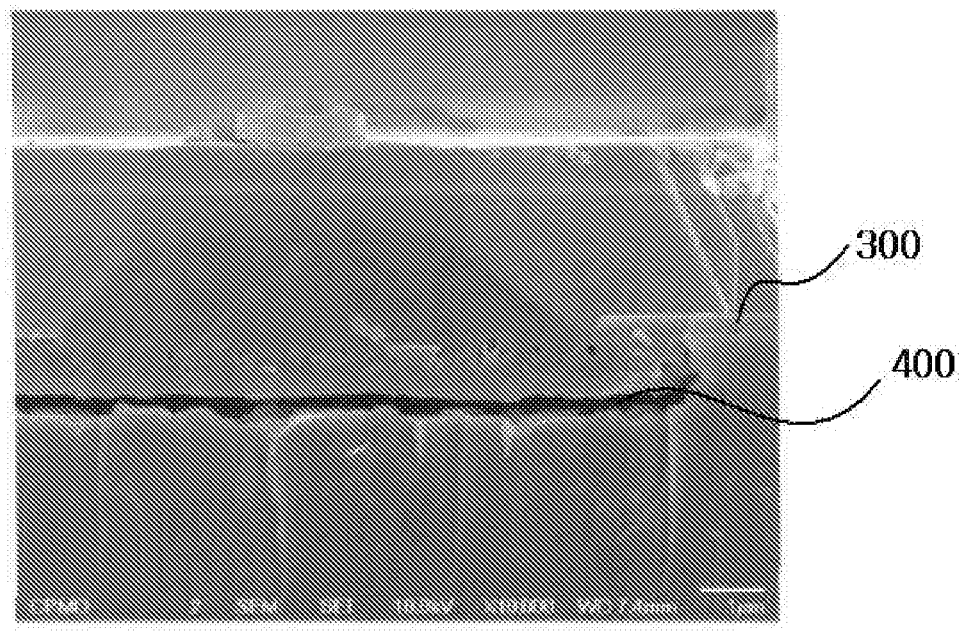
FIG. 3 is an electron micrograph of the nanoporous structure comprising the dielectric layer in accordance with the exemplary embodiment of the present invention.

FIG. 3 is an electron micrograph of a nanoporous structure comprising a dielectric layer in accordance with one exemplary embodiment of the present invention after heat treatment of the nanoporous structure, from which the content of the above description can be confirmed.

Here, for long nano-pores, the radius of the cavity becomes much greater than that of the nano-pores by volume preservation (Equation 1). Under suitable conditions, the radius of the cavity becomes much greater than a cycle of the nano-pores to allow cavities to be connected to each other, whereby the first n-type nitride layer 200 at a lower side is separated from the second n-type nitride layer 500 at an upper side.

Actually, the second n-type nitride layer 500 at the upper side comprises a portion of the first n-type nitride layer 200, which is formed at the upper portion of the nanoporous structure, under the dielectric layer 300.

$$\frac{4}{3}\pi r^3 = \pi a^2 b \qquad \langle \text{Equation 1} \rangle$$

Here, r is a radius of a cavity; a is a radius of a nano-pore; and b is a length of the nano-pore.

A multi-quantum well structure 610 and a p-type nitride layer 620 are sequentially formed on the second n-type nitride layer 500 to form LED structures (S150), and the overall structures are bonded to a conductive substrate 630, which is a wafer, through wafer bonding (S160). In S160, although wafer bonding is performed at high temperature and high pressure, the semiconductor device structures comprising the dielectric layer according to the embodiment of the present invention can sufficiently endure external pressure and thus do not suffer from breakage or defect generation in the course of bonding.

After operation S160, the semiconductor devices are separated from the substrate 100 through selective HF etching of the dielectric layer 300 (S170). When the bonded wafer is removed using a solution, such as HF and the like, which is capable of selectively etching the dielectric layer 300, the semiconductor stack is separated into an upper part and a lower part at the boundary of the connected cavities, thereby enabling lift-off of the semiconductor devices.

Since the dielectric layer 300 formed in S120 supports the separated second n-type nitride layer 500 at the upper side, the epitaxial structure of the second n-type nitride layer 500 at the upper side can be stably maintained, when the nano-pores are combined with each other through thermal deformation and then the second n-type nitride layer 500 at the upper side is separated.

Figure 5:
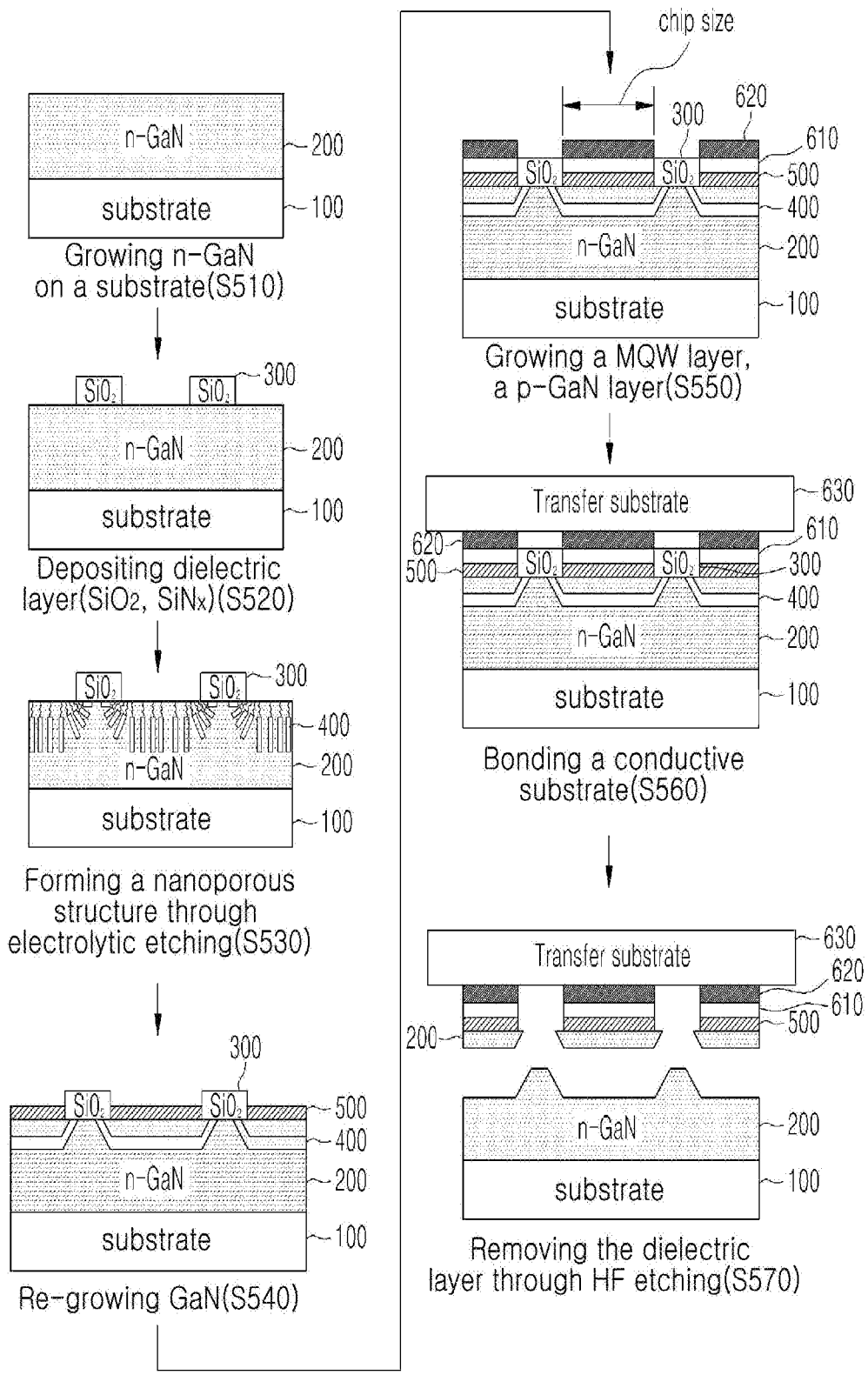
FIG. 5 is a flow diagram of a method for separating semiconductor devices from a substrate using a nanoporous structure in accordance with another exemplary embodiment of the present invention.

FIG. 5 is a flow diagram of a method for separating semiconductor devices from a substrate using a nanoporous structure in accordance with another exemplary embodiment of the present invention, which is different from the embodiment shown in FIG. 1.

The embodiment of FIG. 5 provides a method by which semiconductor chips can be used as soon as the semiconductor chips are separated from a substrate, and a pattern pitch of a dielectric layer 300 is set corresponding to a semiconductor chip size to facilitate separation of the semiconductor chips from the substrate.

First, a first n-type nitride layer 200 is grown on a substrate 100 (S510). Although the first n-type nitride layer can be grown by various methods, typical metal organic chemical vapor deposition (MOCVD) will be described herein.

The substrate 100 may be a gallium nitride substrate, a SiC substrate, a GaAs substrate, a Si substrate, a ZnO substrate, or the like. Generally, a sapphire substrate is used.

After operation S510, the dielectric layer 300 is formed on the first n-type nitride layer 200 such that a pattern pitch of the dielectric layer 300 corresponds to a semiconductor chip size (S520). The dielectric layer 300 acts as a sacrificial layer upon etching and can be formed of any material so long as the selected material allows selective etching. Preferably, the dielectric layer is formed of $SiO_2$ or $SiN_x$.

On the other hand, in S520, the dielectric layer is grown in a stripe pattern or in a lattice pattern that having a size of a few hundred micrometers or more corresponding to a size of a single LED chip. The method of forming the dielectric layer is the same as described above.

After operation S520, a nanoporous structure 400 is formed within the first n-type nitride layer 200 through electrolytic etching (S530). Since the nanoporous structure can be obtained through regulation of doping concentration of an n-type nitride and etching voltage as in the method of forming the nanoporous structure described above, a detailed description thereof will be omitted herein After operation S530, a second n-type nitride layer 500 is re-grown on the first n-type nitride layer 200 (S540). In this case, since the semiconductor structure is separated from the substrate according to the semiconductor chip size, there is no need for a flattening process in regrowth of the second n-type nitride layer 500 unlike operation in S140. That is, since there is no need for flattening of the second n-type nitride layer 500 grown over the dielectric layer upon re-growth of the second n-type nitride layer 500, it is possible to achieve substantial reduction in growth thickness and processing time.

In operation of S540, high temperature is maintained, thereby causing deformation of the nanoporous structure 400. High thermal energy causes movement of atoms on surfaces of nano-pores, so that adjacent nano-pores having an elongated cylinder shape combine with each other, thereby forming a spherical cavity.

A multi-quantum well structure 610 and a p-type nitride layer 620 are sequentially formed on the second n-type nitride layer 500 to form LED structures (S450), and the overall structures are bonded to a conductive substrate 630, which is a wafer, through wafer bonding (S560).

After operation S560, semiconductor devices are separated from the substrate 100 by selective HF etching of the dielectric layer 300 (S570). When the bonded wafer is removed using a solution, such as HF and the like, which is capable of selectively etching the dielectric layer 300, the semiconductor stack is separated into an upper part and a lower part at the boundary of the connected cavities, thereby enabling lift-off of the semiconductor device.

Since the dielectric layer 300 formed in S520 supports the separated second n-type nitride layer 500 at the upper side, the epitaxial structure of the second n-type nitride layer 500 at the upper side can be stably maintained, when the nano-pores structures are combined with each other through thermal deformation and then the second n-type nitride layer 500 at the upper side is separated.

Although some embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

The invention claimed is:

1. A method for separating semiconductor devices from a substrate using a nanoporous structure, the method comprising:
    forming a first conductivity-type nitride layer on a substrate;
    forming a dielectric layer on the first conductivity-type nitride layer;
    forming a nanoporous structure in the first conductivity-type nitride layer using electrolytic etching;
    forming a second first conductivity-type nitride layer on the first conductivity-type nitride layer and the dielectric layer;
    forming a multi-quantum well structure and a second conductivity-type nitride layer on the second first conductivity-type nitride layer;
    bonding the multi-quantum well structure and the second conductivity-type nitride layer to a conductive substrate; and
    separating the second first conductivity-type nitride layer from the substrate by selectively etching the dielectric layer using HF.

2. The method of claim 1, wherein the dielectric layer comprises $SiO_2$ or $SiN_X$.

3. The method of claim 1, wherein forming the dielectric layer comprises forming the dielectric layer in a stripe pattern or a lattice pattern, and the dielectric layer formed at an edge of the substrate is connected to the dielectric layer formed on an inner area of the substrate.

4. The method of claim 1, wherein forming the dielectric layer comprises nano-patterning, the nano-patterning comprising at least one of aluminum anodizing, laser holography patterning, and nanoparticle coating.

5. The method of claim 1, wherein forming the nanoporous structure comprises forming the nanoporous structure within the first n-type nitride layer such that an upper portion of the nanoporous structure has a low porosity and a lower portion of the nanoporous structure has a high porosity by setting an initial voltage to a low value, followed by increasing the voltage after a predetermined period of time, at the same doping concentration.

6. A method for separating semiconductor devices from a substrate using a nanoporous structure, the method comprising:
    forming a first conductivity-type nitride layer on a substrate;
    forming a dielectric layer on the first conductivity-type nitride layer such that a pattern pitch of the dielectric layer corresponds to a semiconductor chip size;
    forming a nanoporous structure in the first conductivity-type nitride layer using electrolytic etching;
    forming a second first conductivity-type nitride layer on the first conductivity-type nitride layer;
    forming a multi-quantum well structure and a second conductivity-type nitride layer on the second first conductivity-type nitride layer;
    bonding the multi-quantum well structure and the second conductivity-type nitride layer to a conductive substrate; and
    separating the second first conductivity-type nitride layer from the substrate by selectively etching the dielectric layer using HF.

7. The method of claim 6, wherein the dielectric layer comprises $SiO_2$ or $SiN_X$.

8. The method of claim 6, wherein forming the dielectric layer comprises nano-patterning, the nano-patterning comprising at least one of aluminum anodizing, laser holography patterning, and nanoparticle coating.

9. The method of claim 6, wherein forming the nanoporous structure comprises forming the nanoporous structure within the first n-type nitride layer such that an upper portion of the nanoporous structure has a low porosity and a lower portion of the nanoporous structure has a high porosity by setting an initial voltage to a low value, followed by increasing the voltage after a predetermined period of time, at the same doping concentration.

* * * * *